United States Patent
Wu et al.

(10) Patent No.: US 8,233,330 B2
(45) Date of Patent: Jul. 31, 2012

(54) SENSE AMPLIFIER USED IN THE WRITE OPERATIONS OF SRAM

(75) Inventors: Jui-Jen Wu, Hsin-Chu (TW); Yi-Tzu Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 734 days.

(21) Appl. No.: 12/347,140

(22) Filed: Dec. 31, 2008

(65) Prior Publication Data

US 2010/0165749 A1    Jul. 1, 2010

(51) Int. Cl.
*G11C 7/00* (2006.01)
(52) U.S. Cl. .............. 365/189.02; 365/205; 365/191
(58) Field of Classification Search ......... 365/189.02, 365/189.05, 198
See application file for complete search history.

(56) References Cited

U.S. PATENT DOCUMENTS

| 6,687,175 | B1 | 2/2004 | Mizuno et al. |
| 7,489,570 | B2 * | 2/2009 | Kim et al. ............... 365/198 |
| 2006/0233027 | A1 * | 10/2006 | Huang ............... 365/189.05 |
| 2007/0127286 | A1 | 6/2007 | Yabe |

* cited by examiner

*Primary Examiner* — Hoai V Ho
*Assistant Examiner* — Pablo Huerta
(74) *Attorney, Agent, or Firm* — Slater & Matsil, L.L.P.

(57) ABSTRACT

A static random access memory (SRAM) circuit includes a pair of complementary global bit-lines, and a pair of complementary local bit-lines. A global read/write circuit is coupled to, and configured to write a small-swing signal to, the pair of global bit-lines in a write operation. The SRAM circuit further includes a first multiplexer and a second multiplexer, each having a first input and a second input. The first input of the first multiplexer and the first input of the second multiplexer are coupled to different one of the pair of global bit-lines. A sense amplifier includes a first input coupled to an output of the first multiplexer, and a second input coupled to an output of the second multiplexer. The sense amplifier is configured to amplify the small-swing signal to a full-swing signal, and outputs the full-swing signal to the pair of local bit-lines in the write operation.

31 Claims, 5 Drawing Sheets

SENSE AMPLIFIER USED IN THE WRITE OPERATIONS OF SRAM

TECHNICAL FIELD

This invention relates generally to integrated circuits, and more particularly to static random access memories (SRAM), and even more particularly to methods and circuits for read and write operations of the SRAM memories.

BACKGROUND

Static random access memory (SRAM) is commonly used in integrated circuits. SRAM cells have the advantageous feature of holding data without a need for refreshing. SRAM cells may include different numbers of transistors, and are often accordingly referred to by the number of transistors, for example, six-transistor (6-T) SRAM, eight-transistor (8-T) SRAM, and the like. The transistors typically form a data latch for storing a bit. Additional transistors may be added to control the access to the transistors. SRAM cells are typically arranged as an array having rows and columns. Typically, each row of the SRAM cells is connected to a word-line, which determines whether the current SRAM cell is selected or not. Each column of the SRAM cells is connected to a bit-line (or a pair of bit-lines), which is used for storing a bit into, or read from, the SRAM cell.

Figure 1:
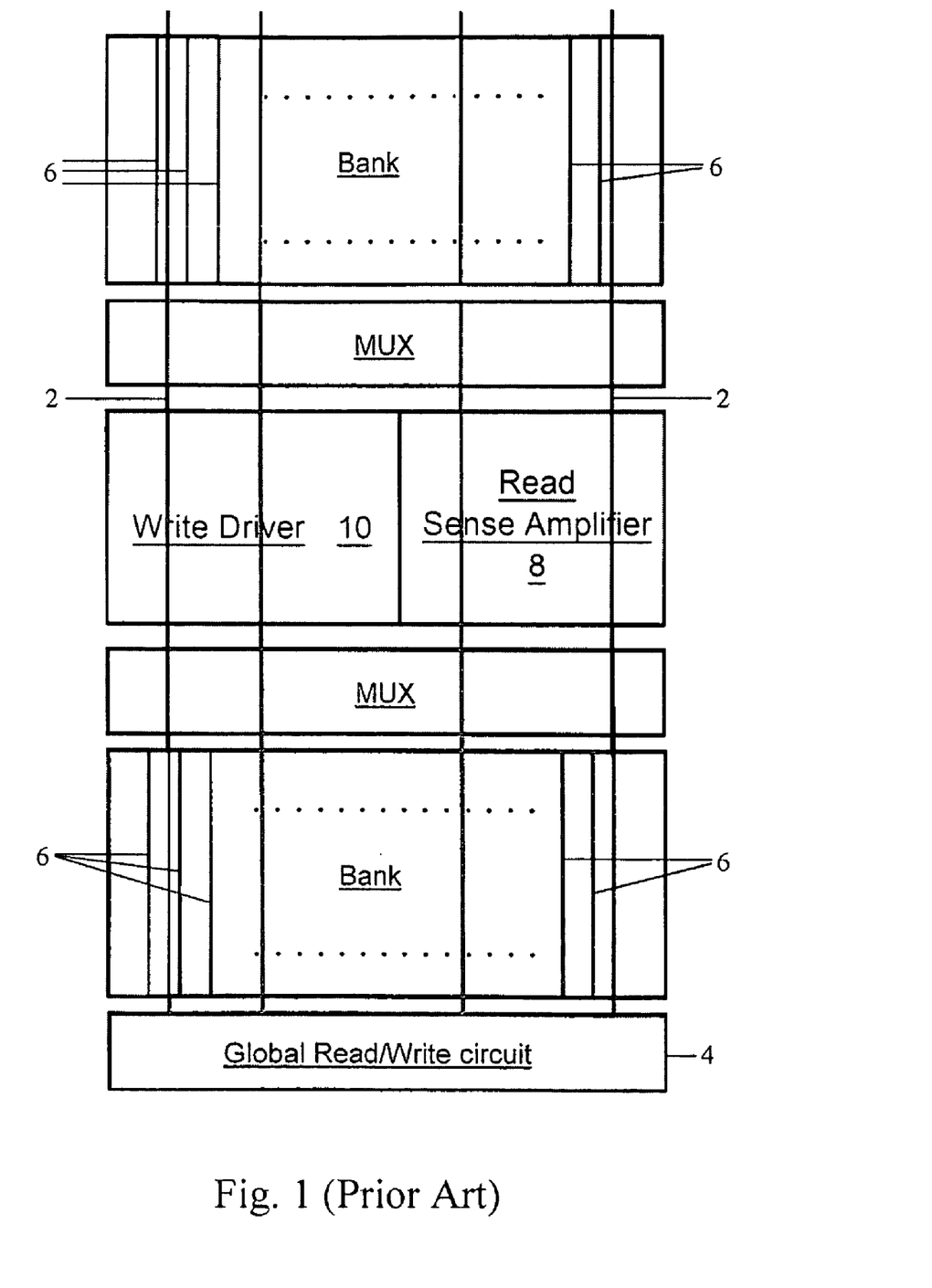
FIG. 1 illustrates a column of a conventional static random access memory.

For the multi-bank design of SRAM memories, long global bit-lines are used to connect columns of banks. FIG. 1 illustrates a portion of a column of a SRAM memory including multiple banks. Global bit-lines 2 (which may form a differential pair) connect global read/write circuit 4 to the banks in the column. In each of the banks, local bit-lines 6 interconnect the SRAM cells inside the respective bank. In a write operation, global read/write circuit 4 generates a full-swing signal and places the signal on global bit-lines 2. With the full-swing signal, one of the global bit-lines 2 has a voltage of VDD, while the other has the voltage of VSS. Write driver 10 receives the full-swing signal from global bit-lines 2, and writes a full-swing signal to local bit-lines 6. In a read operation, read sense amplifier 8 reads a signal from local bit-lines 6, amplifies the signal, and sends the amplified signal to global read/write circuit 4.

The conventional SRAM circuit suffers from drawbacks. During the write operations, writing full-swing signals to global bit-lines 2 is time consuming, particularly when global bit-lines 2 are long. Further, since the writing involves the charging of capacitors, it is also power consuming. A solution is thus needed to solve the above-discussed problems.

SUMMARY OF THE INVENTION

In accordance with one aspect of the present invention, an integrated circuit structure includes a static random access memory (SRAM). The SRAM circuit includes a pair of global bit-lines being complementary to each other, and a pair of local bit-lines being complementary to each other. A global read/write circuit is coupled to, and configured to write a small-swing signal to, the pair of global bit-lines in a write operation. The SRAM circuit further includes a first multiplexer and a second multiplexer, each having a first input and a second input. The first input of the first multiplexer and the first input of the second multiplexer are coupled to different one of the pair of global bit-lines. A sense amplifier includes a first input coupled to an output of the first multiplexer, and a second input coupled to an output of the second multiplexer. The sense amplifier is configured to amplify the small-swing signal to a full-swing signal, and outputs the full-swing signal to the pair of local bit-lines in the write operation.

In accordance with another aspect of the present invention, an integrated circuit structure includes an SRAM circuit, which includes a pair of global bit-lines being complementary to each other; a pair of local bit-lines being complementary to each other; and a global read/write circuit. A sense amplifier is coupled between the global read/write circuit and the pair of local bit-lines. The sense amplifier is configured to, during a read operation, receive a first input signal from the pair of local bit-lines, generate a first output signal from the first input signal, and output the first output signal to the global read/write circuit; The sense amplifier is further configured to, during a write operation, receive a second input signal from the global read/write circuit, generate a second output signal from the second input signal, and output the second output signal to the pair of local bit-lines.

In accordance with yet another aspect of the present invention, an integrated circuit has an SRAM circuit, which includes a pair of global bit-lines being complementary to each other; a pair of local bit-lines being complementary to each other; and a global read/write circuit. The integrated circuit further includes a first multiplexer and a second multiplexer. The first multiplexer has a first input coupled to a first one of the pair of global bit-lines; a second input coupled to a first one of the pair of local bit-lines; and a first output. The second multiplexer has a first input coupled to a second one of the pair of global bit-lines; a second input coupled to a second one of the pair of local bit-lines; and a second output. A sense amplifier includes a first input coupled to the first output of the first multiplexer; a second input coupled to the second output of the second multiplexer; a first output coupled to the global read/write circuit; and a pair of outputs coupled to the pair of local bit-lines.

In accordance with yet another aspect of the present invention, a method of operating an integrated circuit includes providing an SRAM having a pair of local bit-lines; a pair of global bit-lines; and a global read/write circuit. The method includes, during a write operation, writing a small-swing signal to the pair of global bit-lines; amplifying the small-swing signal on the pair of global bit-lines to a full-swing signal; and writing the full-swing signal to the pair of local bit-lines.

In accordance with yet another aspect of the present invention, a method of operating an integrated circuit includes providing an SRAM including a pair of local bit-lines; a pair of global bit-lines; and a global read/write circuit. The method includes, during a write operation, writing a first signal to the pair of global bit-lines; amplifying the first signal on the pair of global bit-lines to a first full-swing signal; and writing the first full-swing signal to the pair of local bit-lines. The method further includes, during a read operation, reading a second signal from the pair of local bit-lines; amplifying the second signal on the pair of local bit-lines to a second full-swing signal, wherein the step of amplifying the first signal and the step of amplifying the second signal are performed by a same sense amplifier; and sending the second full-swing signal to the global read/write circuit.

The advantageous features of the embodiments of the present invention include increased writing speed, reduced power consumption in write operations, and reduced chip area due to the sharing of sense amplifiers for both read and write operations.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel static random access memory (SRAM) read/write circuit embodiment is provided. The variations of the embodiment of the present invention are discussed. Throughout the various views and illustrative embodiments of the present invention, like reference numbers are used to designate like elements.

Figure 2A:
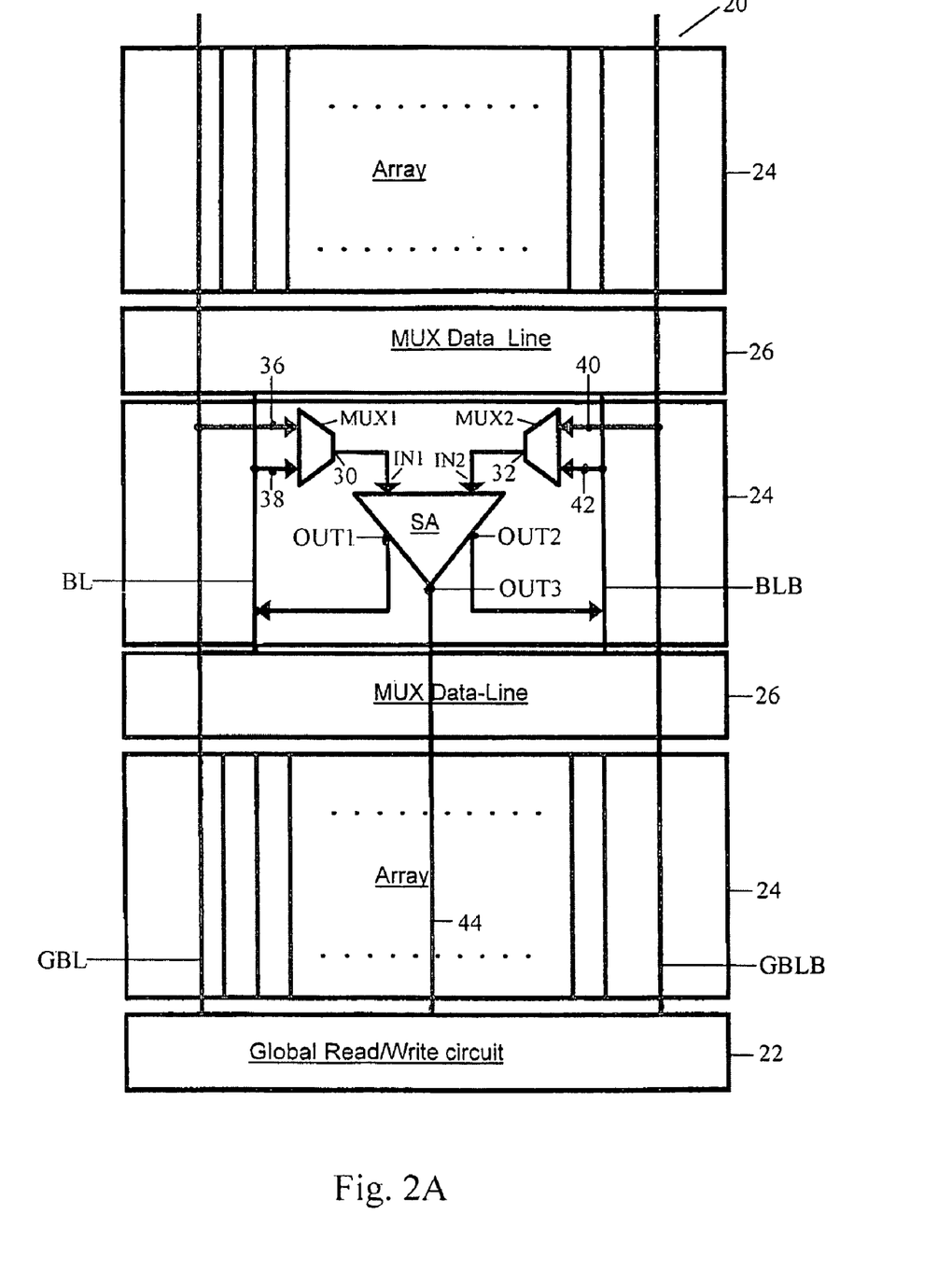
FIGS. 2A and 2B illustrate embodiments of the present invention, wherein sense amplifiers are used for both read and write operations.

FIG. 2A illustrates an embodiment of the present invention. A portion of a column of SRAM memory 20 is illustrated, which includes global read/write circuit 22, arrays 24 (which may also be, or referred to as, banks, macros, or the like), multiplexer (MUX) data-lines 26, complementary global bit-line GBL and GBLB, and complementary local bit-lines BL and BLB. For simplicity, only the details in one of the arrays 24 are illustrated, while other arrays 24 may have the identical structure as the illustrated array. It is realized that the column may include more arrays 24 than illustrated. Global bit-lines GBL and GBLB may extend from the global read/write circuit 22 to the end(s) of the column, and hence all arrays 24 in the column share a same set of global bit-line GBL and GBLB. Global read/write circuit 22 is responsible for the read/write operation of all of the arrays 24 in the column. It is realized that the naming of bit-lines BL and BLB may be reversed, and the naming of bit-lines GBL and GBLB may also be reversed.

In each of the arrays 24, a sense amplifier SA is provided. Sense amplifier SA includes a pair of complementary inputs IN1 and IN2, which often have differential signals. Sense amplifier SA further includes a pair of complementary outputs OUT1 and OUT2, which often have complementary signals. Input IN1 and output OUT1 may be interconnected, and input IN2 and output OUT2 may be interconnected, although they may also be separated from each other. Optionally, sense amplifier SA may include an addition output OUT3, which may output a same signal as one of the outputs OUT1 and OUT2.

Figure 2B:
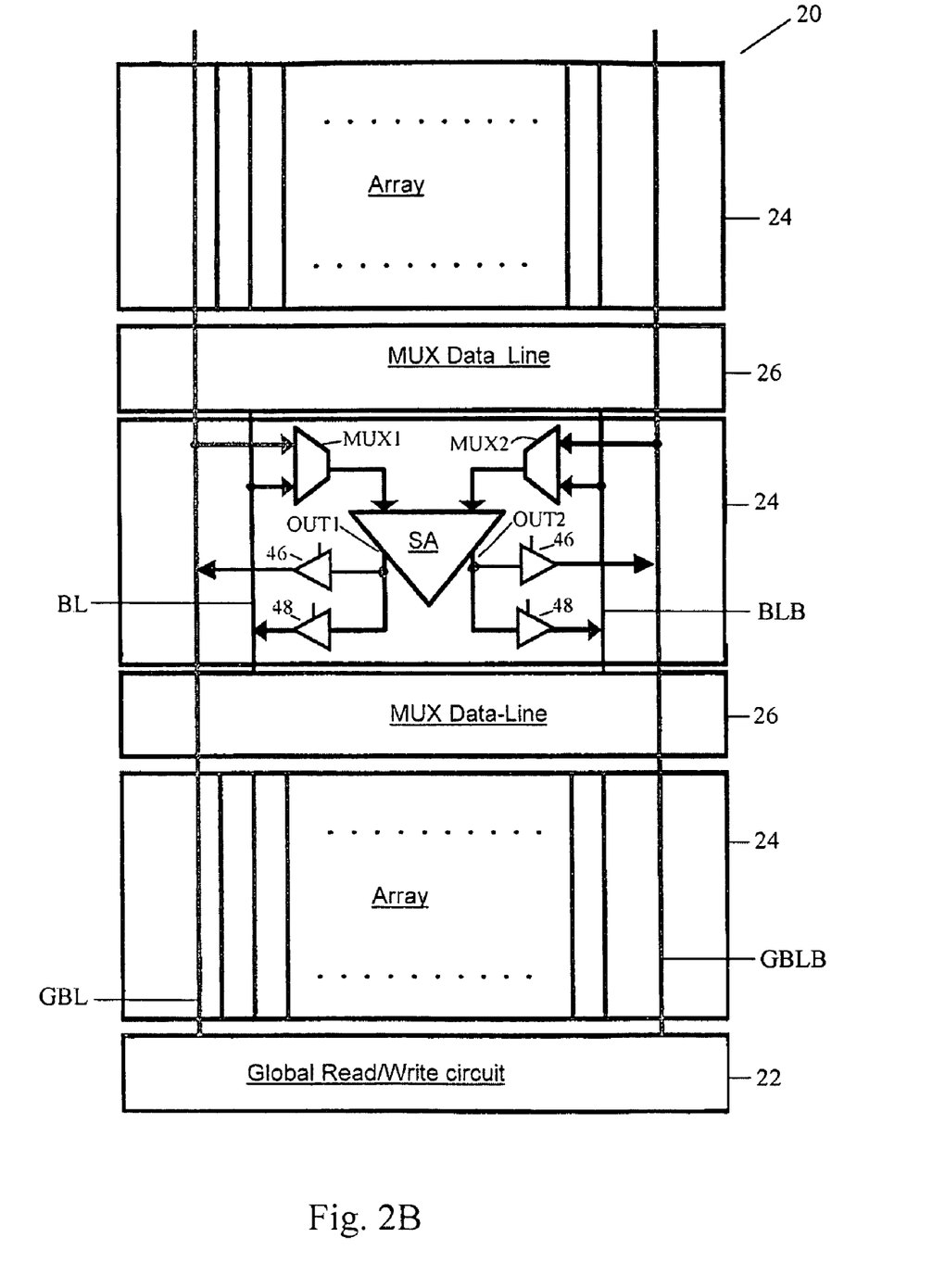

Multiplexers MUX1 and MUX2 are connected to sense amplifier SA, with output 30 of multiplexer MUX1 connected to input IN1, and output 32 of multiplexer MUX2 connected to input IN2. Multiplexer MUX1 has inputs 36 and 38, with inputs 36 being connected to global bit-line GBL, and input 38 being coupled to local bit-line BL. Similarly, multiplexer MUX2 has inputs 40 and 42, with inputs 40 being connected to global bit-line GBLB, and input 42 being coupled to local bit-line BLB. Outputs OUT1 and OUT2 of sense amplifier SA may be connected to local bit-lines BL and BLB, respectively. In an embodiment, sense amplifier SA includes output OUT3, which is connected to global read/write circuit 22 through signal line 44. In alternative embodiments, as shown in FIG. 2B, sense amplifier SA does not include output OUT3. Instead, outputs OUT1 and OUT2 are also connected to global bit-lines GBL and GBLB, for example, through two pairs of tri-state gates 46 and 48 to select whether the outputs OUT1 and OUT2 should be connected to local bit-line BL and BLB or global bit-lines GBL and GBLB.

Multiplexers MUX1 and MUX2 multiplex according to whether an operation is a read operation or a write operation. Referring back to FIG. 2A, in a read operation, multiplexers MUX1 and MUX2 connect inputs 38 and 42, respectively, to inputs IN1 and IN2 of sense amplifier SA. Since inputs 38 and 42 are connected to local bit-lines BL and BLB, respectively, sense amplifier SA receives signals from local bit-lines BL and BLB, and amplifies the signal read from local bit-lines BL and BLB to a full-swing signal. The full-swing signal is then outputted from output OUT3 to global read/write circuit 22. Alternatively, the full-swing signal, as shown in FIG. 2B, is sent to global bit-lines GBL and GBLB through tri-state gates 46. Global read/write circuit 22 then receives the full-swing signal from global bit-lines GBL and GBLB.

In a write operation, global read/write circuit 22 sends a small-swing signal to global bit-lines GBL and GBLB. The small-swing signal has a magnitude less than the magnitude of the full-swing signal, wherein the magnitudes of the small-swing signal and the full-swing signal are the voltage difference between two differential signals, for example, on differential global bit-lines GBL and GBLB. In an exemplary embodiment, the full-swing signal has a magnitude of (VDD-VSS), wherein voltages VDD and VSS are the power supply voltages of SRAM memory 20. The small-swing signal preferably has a magnitude less than about 80 percent, more preferably less than about 50 percent, and even more preferably less than about 20 percent, or even less than about ten percent, of the magnitude of the full-swing signal. Even more preferably, the magnitude of the small-swing signal is as small as possible, providing it is greater enough, so that even the sense amplifier SA located farthest from the global read/write circuit 22 can still successfully amplify it to the full-swing signal. In an exemplary embodiment of the present invention, the small-swing signal has a magnitude of less than about 200 mV, and may be as low as about 100 mV.

In the write operation, multiplexers MUX1 and MUX2 connect inputs 36 and 40 to inputs IN1 and IN2 of sense amplifier SA, respectively. Since inputs 36 and 40 are connected to global bit-lines GBL and GBLB, respectively, sense amplifier SA receives the small-swing signal from global bit-lines GBL and GBLB, amplifies the small-swing signal to a full-swing signal, and outputs the full-swing signal from outputs OUT1 and OUT2 to local bit-lines BL and BLB. In the exemplary embodiment shown in FIG. 2B, the output is sent to local bit-lines BL and BLB through tri-state gates 48.

An advantageous feature of the present invention is that during write operations, global read/write circuit 22 only needs to write a small-swing signal, instead of a full-swing signal, to global bit-lines GBL and GBLB. As is known in the art, writing to global bit-lines GBL and GBLB may involve charging capacitors, less power is needed in the embodiments of the present invention since the charge amount on a capacitor is proportional to the voltage on the capacitor. Further, global bit-lines GBL and GBLB may be very long, and hence have un-negligible parasitic capacitances, replacing the full-swing signal with the small-swing signal thus saves the time for writing to global bit-lines GBL and GBLB. The write speed may thus be increased.

Figure 3:
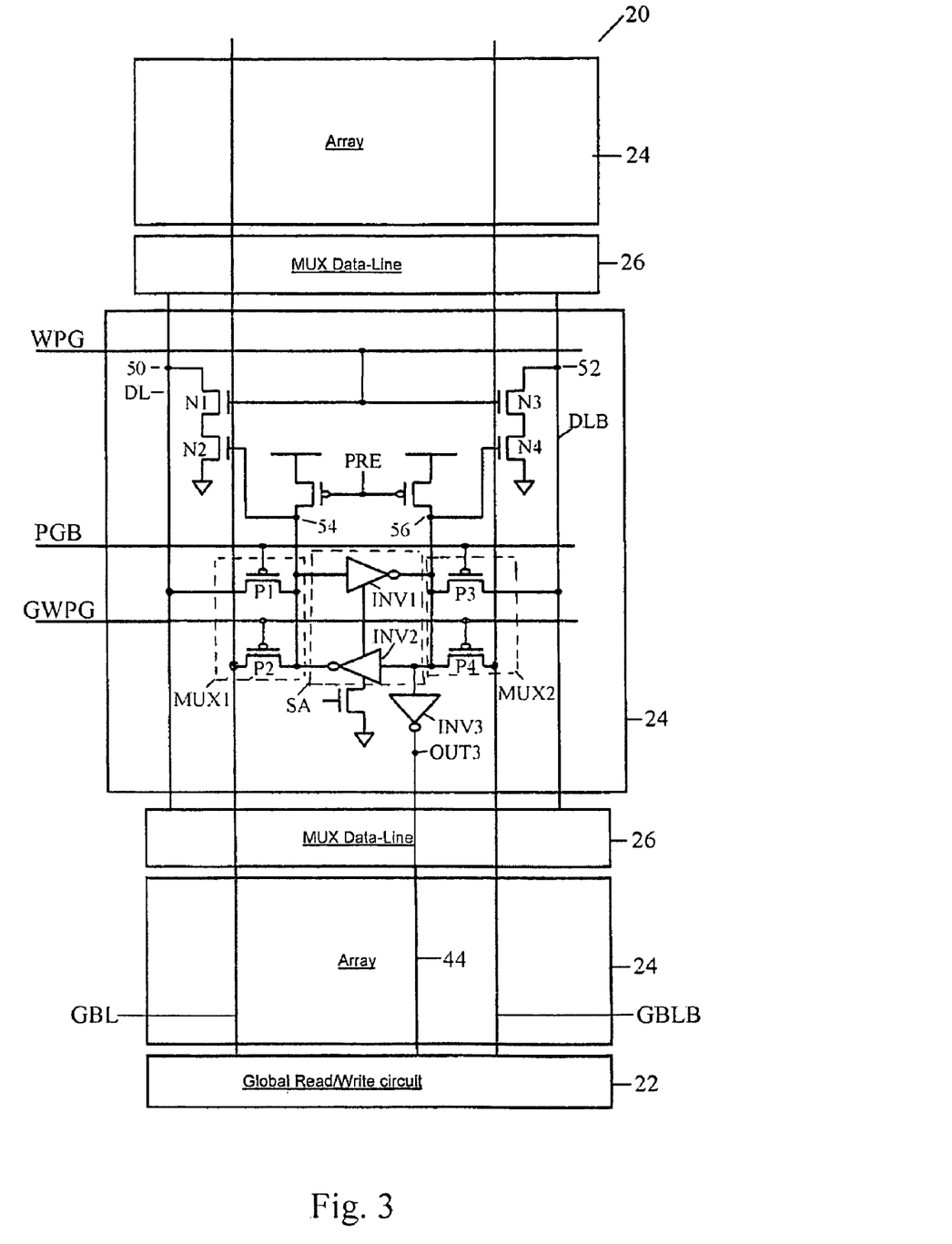
FIG. 3 illustrates a circuit for implementing the embodiment shown in FIG. 2A.

FIG. 3 illustrates a circuit implementing the embodiment shown in FIG. 2A. One skilled in the art will realize that the block diagrams shown in FIGS. 2A and 2B may be implemented with different circuits. Referring to FIG. 3, inverters INV1 and INV2 forms the sense amplifier SA as show in FIG. 2A, while PMOS transistors P1 and P2 forms multiplexer MUX1, and PMOS transistors P3 and P4 forms multiplexer MUX2. Signal lines PGB (pass-gate bar, which indicates read operations when set to logic low) and GWPG (global write pass-gate, which indicates write operations when set to logic low) control whether the signal from global bit-lines GBL and GBLB or the signal from data lines DL and DLB should be input into sense amplifier SA. Data lines DL and DLB are further connected to local bit-lines BL and BLB (not shown in FIG. 3, please refer to FIG. 2) through MUX data-line 26. Therefore, nodes 50 and 52 may be treated as being the outputs OUT1 and OUT2 as shown in FIG. 2A, respectively, although the actual outputs OUT1 and OUT2 as shown in FIG. 2A may actually be the nodes (not shown) connected to MUX data-lines 26. NMOS transistors N1 and N2 form the circuit for writing to data line DL. NMOS transistors N3 and N4 form the circuit for writing to data line DLB.

In a write operation, global read/write circuit 22 sends a small-swing signal to global bit-lines GBL and GBLB. Line GWPG is set to low to turn on PMOS transistors P2 and P4, so that the small-swing signal is received by nodes 54 and 56 (nodes of sense amplifier SA). The small-swing signal on nodes 54 and 56 is amplified to a full-swing signal. One of the nodes 54 and 56 turns on the respective NMOS transistors N2 and N4, so that the respective data lines DL and DBL (which are pre-charged to voltage VDD) are discharged to a ground, while the other one of the data lines DL and DBL remains to be at voltage VDD. Accordingly, the full-swing signal is written to data lines DL and DLB, and further routed to corresponding bit-lines BL and BLB (not shown).

During a read operation, line PGB is set to low to turn on PMOS transistors P1 and P3, so that the signal on data lines DL and DLB (which are also the signal on bit-lines) is read into sense amplifier SA and amplified to a full-swing signal. The resulting full-swing signal is then sent to global read/write circuit 22 through output OUT3. Please note that inverter INV3 may be considered to be an internal part of sense amplifier, or an external part.

Figure 4:
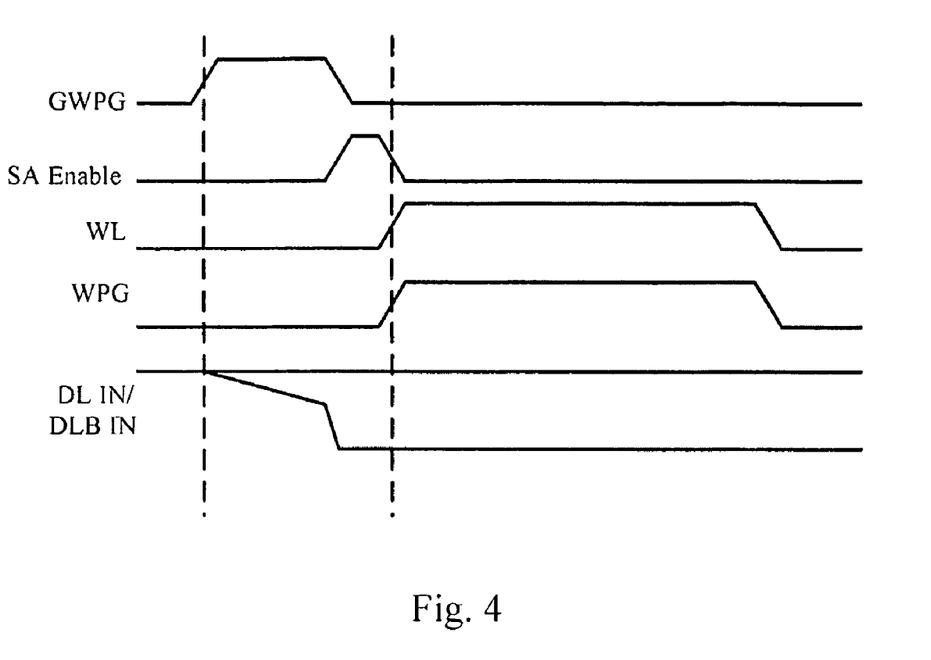
FIG. 4 illustrates a sequence diagram of a write operation.

FIG. 4 schematically illustrates a sequence diagram. Besides the signals discussed in the preceding paragraphs, signals marked as sense amplifier enable (SAE) and word-line signal (WL) are also illustrated to show the timing of the signals.

The embodiments of the present invention have several advantageous features. First, during write operations, instead of writing full-swing signals to global bit-lines, small-swing signals are written to global bit-lines. The write operations may thus be faster, with shorter global bit-line pulses needed. The power is also saved. The sense amplifiers in the embodiments of the present invention are used by both read operations and write operations, and hence at least parts of the conventional local write drivers are no longer needed. The chip area is thus saved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
  a static random access memory (SRAM) circuit comprising:
    a pair of global bit-lines being complementary to each other;
    a pair of local bit-lines being complementary to each other;
    a global read/write circuit coupled to, and configured to write a small-swing signal to, the pair of global bit-lines in a write operation;
    a first multiplexer and a second multiplexer, each comprising a first input and a second input, wherein the first input of the first multiplexer and the first input of the second multiplexer are coupled to different ones of the pair of global bit-lines; and
    a sense amplifier comprising a first input coupled to an output of the first multiplexer, and a second input coupled to an output of the second multiplexer, wherein the sense amplifier is configured to amplify the small-swing signal to a full-swing signal, and outputs the full-swing signal to the pair of local bit-lines in the write operation.

2. The integrated circuit structure of claim 1, wherein the small-swing signal has a magnitude less than about 50 percent of the full-swing signal.

3. The integrated circuit structure of claim 1, wherein the second input of the first multiplexer and the second input of the second multiplexer are coupled to the pair of local bit-lines.

4. The integrated circuit structure of claim 3, wherein the first multiplexer is configured to connect the first input of the first multiplexer to the output of the first multiplexer in the write operation, and connect the second input of the first multiplexer to the output of the first multiplexer in a read operation; and
  wherein the second multiplexer is configured to connect the first input of the second multiplexer to the output of the second multiplexer in the write operation, and connect the second input of the second multiplexer to the output of the second multiplexer in the read operation.

5. The integrated circuit structure of claim 1, wherein the sense amplifier is further configured to output an additional full-swing signal to the global read/write circuit in a read operation.

6. The integrated circuit structure of claim 5, wherein the sense amplifier is configured to, in the read operation, output the full-swing signal to the global read/write circuit through the pair of global bit-lines.

7. The integrated circuit structure of claim 5, wherein the sense amplifier is configured to, in the read operation, output the full-swing signal to the global read/write circuit through a signal line separated from the pair of global bit-lines.

8. An integrated circuit structure comprising:
  a static random access memory (SRAM) circuit comprising:
    a pair of global bit-lines being complementary to each other;
    a pair of local bit-lines being complementary to each other;

a global read/write circuit; and
a sense amplifier coupled between the global read/write circuit and the pair of local bit-lines, wherein the sense amplifier is configured to:
during a read operation, receive a first input signal from the pair of local bit-lines, generate a first output signal from the first input signal, and output the first output signal to the global read/write circuit; and
during a write operation, receive a second input signal from the global read/write circuit, generate a second output signal from the second input signal, and output the second output signal to the pair of local bit-lines.

9. The integrated circuit structure of claim 8, wherein the second input signal is a small-swing signal, and wherein during the write operation, the sense amplifier receives the second input signal from the global read/write circuit through the pair of global bit-lines.

10. The integrated circuit structure of claim 9, wherein the second input signal has a magnitude less than about 20 percent of the second output signal.

11. The integrated circuit structure of claim 8, wherein during the read operation, the sense amplifier outputs the first output signal to the global read/write circuit through the pair of global bit-lines.

12. The integrated circuit structure of claim 8, wherein during the read operation, the sense amplifier outputs the first output signal to the global read/write circuit through a signal line separated from the pair of global bit-lines.

13. The integrated circuit structure of claim 8 further comprising:
a first multiplexer comprising a first input coupled to a first one of the pair of global bit-lines, and a second input coupled to a first one of the pair of local bit-lines, and a first output coupled to a first input of the sense amplifier; and
a second multiplexer comprising a first input coupled to a second one of the pair of global bit-lines, and a second input coupled to a second one of the pair of local bit-lines, and a second output coupled to a second input of the sense amplifier.

14. An integrated circuit structure comprising:
a static random access memory (SRAM) circuit comprising:
a pair of global bit-lines being complementary to each other;
a pair of local bit-lines being complementary to each other;
a global read/write circuit;
a first multiplexer comprising:
a first input coupled to a first one of the pair of global bit-lines;
a second input coupled to a first one of the pair of local bit-lines; and
a first output;
a second multiplexer comprising:
a first input coupled to a second one of the pair of global bit-lines;
a second input coupled to a second one of the pair of local bit-lines; and
a first output; and
a sense amplifier comprising:
a first input coupled to the first output of the first multiplexer;
a second input coupled to the second output of the second multiplexer;
a first output coupled to the global read/write circuit; and
a pair of outputs coupled to the pair of local bit-lines.

15. The integrated circuit structure of claim 14, wherein the first output of the sense amplifier is coupled to the global read/write circuit through a signal line separated from the pair of global bit-lines.

16. The integrated circuit structure of claim 14, wherein the first output of the sense amplifier is coupled to the global read/write circuit through the pair of global bit-lines.

17. The integrated circuit structure of claim 14, wherein the global read/write circuit is configured to write a small-swing signal to the pair of global bit-lines during a write operation.

18. The integrated circuit structure of claim 17, wherein the sense amplifier is configured to:
during a read operation, receive a first input signal from the pair of local bit-lines, generate a first full-swing signal from the first input signal, and output the first full-swing signal to the global read/write circuit; and
during the write operation, receive the small-swing signal from the pair of global bit-lines, generate a second full-swing signal from the small-swing signal, and outputs the second full-swing signal to the pair of local bit-lines.

19. The integrated circuit structure of claim 14, wherein the first multiplexer comprises:
a first PMOS transistor having a source/drain path coupled between the first input of the first multiplexer and the first output of the first multiplexer; and
a second PMOS transistor having a source/drain path coupled between the first input of the second multiplexer and the first output of the second multiplexer.

20. A method of operating an integrated circuit, the method comprising:
providing a static random access memory (SRAM) comprising:
a pair of local bit-lines;
a pair of global bit-lines; and
a global read/write circuit; and
during a write operation:
writing a small-swing signal to the pair of global bit-lines;
amplifying the small-swing signal on the pair of global bit-lines to a full-swing signal; and
writing the full-swing signal to the pair of local bit-lines.

21. The method of claim 20 further comprising:
during a read operation:
receiving a signal from the pair of local bit-lines;
amplifying the signal to an additional full-swing signal; and
sending the additional full-swing signal to the global read/write circuit, wherein the step of amplifying the small-swing signal to the full-swing signal and the step of amplifying the signal to the additional full-swing signal are performed by a same sense amplifier.

22. The method of claim 21 further comprising:
providing a pair of multiplexers;
during the read operation, using the pair of multiplexers to connect the signal on the pair of local bit-lines to inputs of the same sense amplifier; and
during the write operation, using the pair of multiplexers to connect the small-swing signal on the pair of global bit-lines to the inputs of the same sense amplifier.

23. The method of claim 21, wherein the step of sending the additional full-swing signal to the global read/write circuit comprises:
sending the additional full-swing signal to the pair of global bit-lines; and receiving the additional full-swing signal from the pair of global bit-lines into the global read/write circuit.

24. The method of claim 21, wherein the step of sending the additional full-swing signal to the global read/write circuit comprises:
sending the additional full-swing signal to a signal line separated from the pair of global bit-lines; and
receiving the additional full-swing signal from the signal line into the global read/write circuit.

25. A method of operating an integrated circuit, the method comprising:
providing a static random access memory (SRAM) comprising:
a pair of local bit-lines;
a pair of global bit-lines; and
a global read/write circuit;
during a write operation:
writing a first signal to the pair of global bit-lines;
amplifying the first signal on the pair of global bit-lines to a first full-swing signal; and
writing the first full-swing signal to the pair of local bit-lines; and
during a read operation:
reading a second signal from the pair of local bit-lines;
amplifying the second signal on the pair of local bit-lines to a second full-swing signal, wherein the step of amplifying the first signal and the step of amplifying the second signal are performed by a same sense amplifier; and
sending the second full-swing signal to the global read/write circuit.

26. The method of claim 25, wherein the first signal is a small-swing signal having a first magnitude smaller than 50 percent of a second magnitude of the first full-swing signal.

27. The method of claim 26, wherein the first magnitude is less than about 20 percent of the second magnitude.

28. The method of claim 26, wherein the first magnitude is less than about 200 mV.

29. The method of claim 25 further comprising:
providing a pair of multiplexers;
during the read operation, using the pair of multiplexers to connect the second signal on the pair of local bit-lines to inputs of the same sense amplifier; and
during the write operation; using the pair of multiplexers to connect the first signal on the pair of global bit-lines to the inputs of the same sense amplifier.

30. The method of claim 25, wherein the step of sending the second full-swing signal to the global read/write circuit comprises:
sending the second full-swing signal to the pair of global bit-lines; and
receiving the second full-swing signal from the pair of global bit-lines into the global read/write circuit.

31. The method of claim 25, wherein the step of sending the second full-swing signal to the global read/write circuit comprises:
sending the second full-swing signal to a signal line separated from the pair of global bit-lines; and
receiving the second full-swing signal from the signal line into the global read/write circuit.

\* \* \* \* \*